United States Patent
Yamane et al.

[11] Patent Number: 5,825,685
[45] Date of Patent: Oct. 20, 1998

[54] HIGH-SPEED, LOW-CURRENT MAGNETORESISTIVE MEMORY DEVICE

[75] Inventors: Haruki Yamane; Yoshinori Maeno; Masanobu Kobayashi, all of Tokyo, Japan

[73] Assignee: Oki Electric Industry Co., Ltd., Tokyo, Japan

[21] Appl. No.: 979,791

[22] Filed: Nov. 26, 1997

Related U.S. Application Data

[62] Division of Ser. No. 745,479, Nov. 12, 1996, Pat. No. 5,745,406.

[30] Foreign Application Priority Data

Nov. 12, 1995 [JP] Japan .................................. 7-294003

[51] Int. Cl.$^6$ ............................ G11C 11/00; G11C 11/56
[52] U.S. Cl. ........................ 365/158; 365/168; 365/173
[58] Field of Search ................................... 365/158, 168, 365/173, 171

[56] References Cited

U.S. PATENT DOCUMENTS

| | | | |
|---|---|---|---|
| 4,857,418 | 8/1989 | Schuetz | 365/158 |
| 5,173,873 | 12/1992 | Wu et al. | 365/173 |
| 5,448,515 | 9/1995 | Fukami et al. | 365/171 |
| 5,541,868 | 7/1996 | Prinz | 365/173 X |
| 5,583,727 | 12/1996 | Parkin | 365/173 X |
| 5,587,943 | 12/1996 | Torok et al. | 365/158 |
| 5,636,159 | 6/1997 | Pohm | 365/158 |
| 5,650,958 | 7/1997 | Gallagher et al. | 365/173 |

FOREIGN PATENT DOCUMENTS

| | | |
|---|---|---|
| 0613148A2 | 8/1994 | European Pat. Off. |
| WO95/10112 | 4/1995 | WIPO |

OTHER PUBLICATIONS

"Spin–Valve Memory Elements Using [{Co–Pt/Cu/Ni–Fe–Co}/Cu] Multilayers", Yousuke Irie et al, Japan Journal of Physics, vol. 34 (1995), pp. 415–417.

"Magnetoresistive Memory Technology", J.M. Daughton, Thin Solid Films 216 (1992), pp. 162–168, Elsevier Sequoia.

*Primary Examiner*—Huan Hoang
*Attorney, Agent, or Firm*—Spencer & Frank

[57] ABSTRACT

A memory cell has two magnetoresistive memory elements, each with at least two ferromagnetic layers. The electrical resistance of each memory element differs depending on whether the ferromagnetic layers are magnetized in the parallel or antiparallel state. Binary information is stored in the memory cell by supplying currents that generate magnetic fields setting one memory element to the parallel state and the other memory element to the antiparallel state. Alternatively, ternary information is stored, two of the ternary values being stored in the same way as the binary values, and the third ternary value being stored by setting both memory elements to the same state. The stored values are read by comparing the resistances of the two memory elements.

13 Claims, 12 Drawing Sheets

HIGH-SPEED, LOW-CURRENT MAGNETORESISTIVE MEMORY DEVICE

This is a Division of application Ser. No. 08/745,479 filed Nov. 12, 1996, now U.S. Pat. No. 5,745,406.

BACKGROUND OF THE INVENTION

The present invention relates to a magnetoresistive memory device, more particularly to a magnetoresistive memory device adapted for quick read-out and low current consumption.

Magnetoresistive memory, also known as ferromagnetic memory or ferroelectric memory, is a type of nonvolatile memory that offers the advantages of unlimited data retention, fast write access, and unlimited write-erase cycles. Several types of magnetoresistive memory elements are known; their common property is that their electrical resistance varies depending on the direction of magnetization of one or more ferromagnetic layers within the element, permitting information to be stored as different magnetic states. Information is written by means of a pulse of write current that magnetizes the ferromagnetic layers in the desired state. Typically, the stored information is '1' or '0' depending on the direction of the write current.

A magnetoresistive memory element is commonly read by interrogating the element with a smaller current pulse that temporarily perturbs the magnetization state, and detecting the resulting change in electrical resistance. The paper "Spin-Valve Memory Elements Using [{Co-Pt/Cu/Ni-Fe-Co}/Cu] Multilayers" in the April 1995 Japanese Journal of Applied Physics, for example, describes a magnetoresistive memory element that is read by applying a positive current pulse followed by a negative current pulse and detecting whether the electrical resistance rises or falls between the two pulses. Other schemes manage with only a single interrogating current pulse, but in any case, the need to interrogate the memory element with a current pulse and detect the resulting resistance change has two unwanted effects: extra current is consumed during read access; and the time required for read access is lengthened.

European Patent Application 0 613 148 A2 describes a magnetoresistive memory element that is read by detecting the electrical resistance directly, without using an interrogating pulse to perturb the magnetization. The memory element is accessed via a transverse write/sense current line and a longitudinal write current line. Write access is performed by supplying current to both lines. Read access is performed via the transverse write/sense current line. A memory cell comprises an active memory element of this type, and a reference memory element having no write current line. In read access, the resistance of the active memory element is compared with the resistance of the reference memory element.

One disadvantage of this scheme is its inherent inefficiency, since no information is stored in the reference memory element in each memory cell. A further disadvantage is that the need to supply write current on two separate paths complicates the write access process.

SUMMARY OF THE INVENTION

It is therefore an object of the present invention to store information efficiently in a magnetoresistive memory device.

A further object of the invention is to read the stored information rapidly, with low current consumption.

According to one aspect of the invention, a magnetoresistive memory device has at least one memory cell comprising a first memory element and a second memory element. Each of these memory elements has at least two ferromagnetic layers, and has an electrical resistance that differs depending on whether the ferromagnetic layers are magnetized in the parallel or antiparallel state. Each memory element also has a writing electrode to which current can be supplied. The supplied current generates a magnetic field capable of switching the ferromagnetic layers between the parallel and antiparallel states.

Binary information is stored in this memory cell by supplying appropriate currents to the writing electrodes of the two memory elements. To store a first binary value, currents are supplied that set the ferromagnetic layers in the first memory element to the parallel state, and the ferromagnetic layers in the second memory element to the antiparallel state. To store a second binary value, currents are supplied that set the ferromagnetic layers in the first memory element to the antiparallel state, and the ferromagnetic layers in the second memory element to the parallel state. The stored value is read by comparing the resistances of the two memory elements.

According to a second aspect of the invention, ternary information is stored in the same memory cell. The first and second ternary values are stored in the same way as the first and second binary values. The third ternary value is stored by supplying currents that set the ferromagnetic layers in both memory elements to the same state: both parallel, or both antiparallel.

According to a third aspect of the invention, binary information is stored in a memory cell having only one memory element of the type described above, the parallel state representing the first binary value and the antiparallel state the second binary value. The stored value is read by detecting the resistance of the memory element.

BRIEF DESCRIPTION OF THE DRAWINGS

The invention will be described below with reference to the attached drawings, in which.

DETAILED DESCRIPTION OF THE INVENTION

Two examples of magnetoresistive memory elements that can be employed in the present invention will first be described, and the storing of information in these elements explained. Next a novel type of memory cell will be described, and methods of storing binary and ternary information in this memory cell will be explained. Finally, novel memory devices comprising row-column arrays of the above memory cells and elements will be described.

Figure 1:
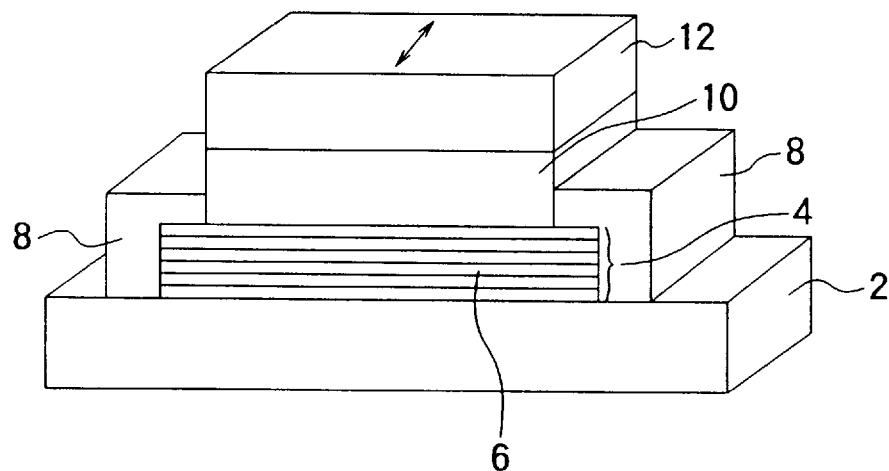
FIG. 1 illustrates a magnetoresistive memory element of the spin-valve type.

First, a magnetoresistive memory element of the spin-valve type will be described. Referring to FIG. 1, this element is formed on a substrate 2 made of, for example, magnesium oxide. A magnetoresistive structure 4 comprising at least one and preferably more than one spin valve 6 is deposited by a sputtering process on the substrate 2. In the drawing, six spin valves 6 have been deposited one above another. Sensing electrodes 8 are formed at each end of the magnetoresistive structure 4. An insulating layer 10 made of, for example, silicon dioxide ($SiO_2$) is formed on top of the magnetoresistive structure 4, and a writing electrode 12 is formed on the insulating layer 10.

Figure 2:
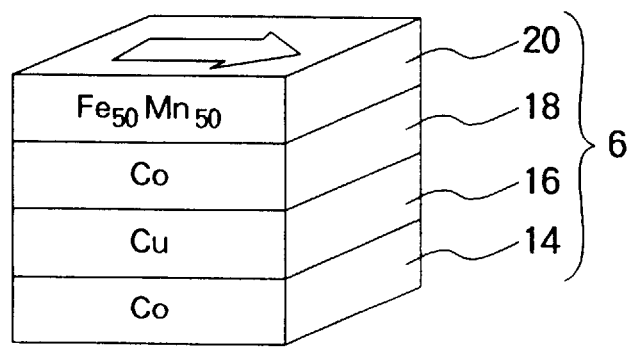
FIG. 2 illustrates the structure of one spin valve in FIG. 1.

Referring to FIG. 2, each spin valve 6 comprises a multilayer sandwich having a first ferromagnetic layer 14, a nonmagnetic layer 16, a second ferromagnetic layer 18, and an antiferromagnetic Layer 20. These layers may be made of various materials: for example, the ferromagnetic layers 14 and 18 of cobalt (Co), the nonmagnetic layer 16 of copper (Cu), and the antiferromagnetic layer 20 of an iron-manganese alloy ($Fe_{50}Mn_{50}$), as illustrated.

The antiferromagnetic layer 20 is magnetized during the fabrication process so that its magnetic vector points in a particular direction, e.g. to the right in FIGS. 1 and 2, as indicated by the arrow in FIG. 2. The second ferromagnetic layer 18 is spin-coupled to the antiferromagnetic layer 20, so its magnetic vector has a strong tendency to orient in the same direction. The nonmagnetic layer 16 prevents spin-coupling of the first ferromagnetic layer 14, so the magnetic vector of the first ferromagnetic layer 14 has a weaker tendency to orient in this direction.

Magnetic fields can be applied to the magnetoresistive structure 4 by feeding current through the writing electrode 12 in the directions indicated by the arrow in FIG. 1, which are preferably perpendicular to the magnetization direction of the antiferromagnetic layer 20. In the magnetoresistive structure 4, the magnetic vector of the applied field points substantially to the right or the left, depending on the direction of flow of the current.

Figure 3:
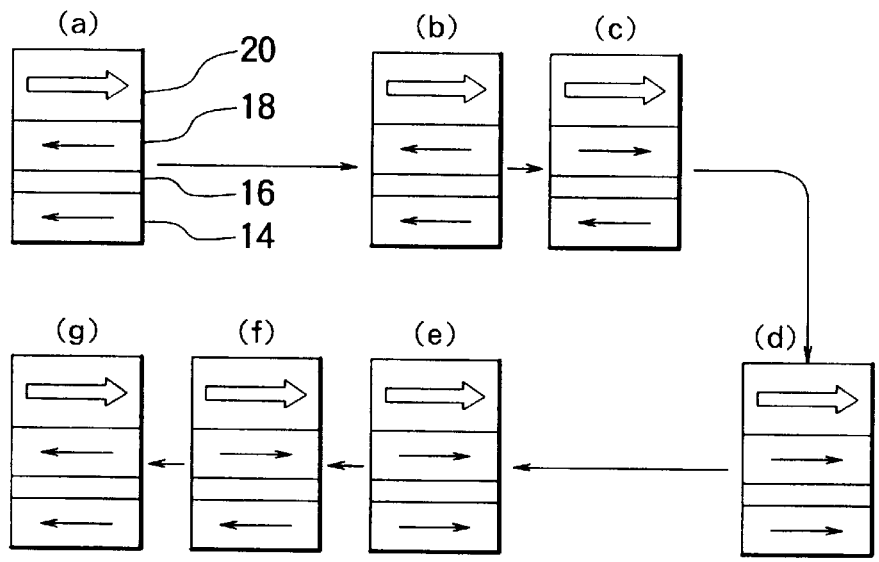
FIG. 3 illustrates transitions in the magnetization of the memory element in FIG. 1 in response to an applied magnetic field.

FIG. 3 illustrates the response of the magnetoresistive structure 4 when the current is swept back and forth between these two directions. The applied magnetic field will be described as negative if its magnetic vector points to the left, and positive if its magnetic vector points to the right. The current that produces the magnetic field will be described as positive or negative according to whether the magnetic field is positive or negative.

Initially, a comparatively high negative current is applied, producing a negative magnetic field strong enough to overcome the effect of the antiferromagnetic layer 20 and magnetize both the first and second ferromagnetic layers 14 and 18 toward the left (a). This magnetization is retained as the current is reduced, even when the current and hence the applied magnetic field become zero (b). When the current and applied magnetic field become positive, however, the magnetization of the second ferromagnetic layer 18 quickly reverses to align with the magnetization of the antiferromagnetic layer 20, pointing toward the right (c). At a stronger positive current and applied magnetic field, the magnetization of the first ferromagnetic layer 14 also reverses to point toward the right (d).

When the current flow and magnetic field are swept down from this state (d), at the zero point, the first and second ferromagnetic layers 14 and 18 remain magnetized toward the right (e). At a certain negative current level and negative magnetic field intensity, the magnetization of the first ferromagnetic layer 14 flips back to point to the left, while the second ferromagnetic layer 18 remains pinned in the right-pointing state by the antiferromagnetic layer 20 (f). At a stronger negative current and magnetic field intensity, the magnetization of the second ferromagnetic layer 18 also flips back to point to the left (g).

The first and second ferromagnetic layers 14 and 18 are said to be magnetized in the parallel state when their magnetic vectors both point in the same direction, as in states (a), (b), (d), (e), and (g), and in the antiparallel state when their magnetic vectors point in opposite directions, as in states (c) and (f). The electrical resistance of the magnetoresistive structure 4 is higher in the antiparallel state than in the parallel state.

Figure 4:
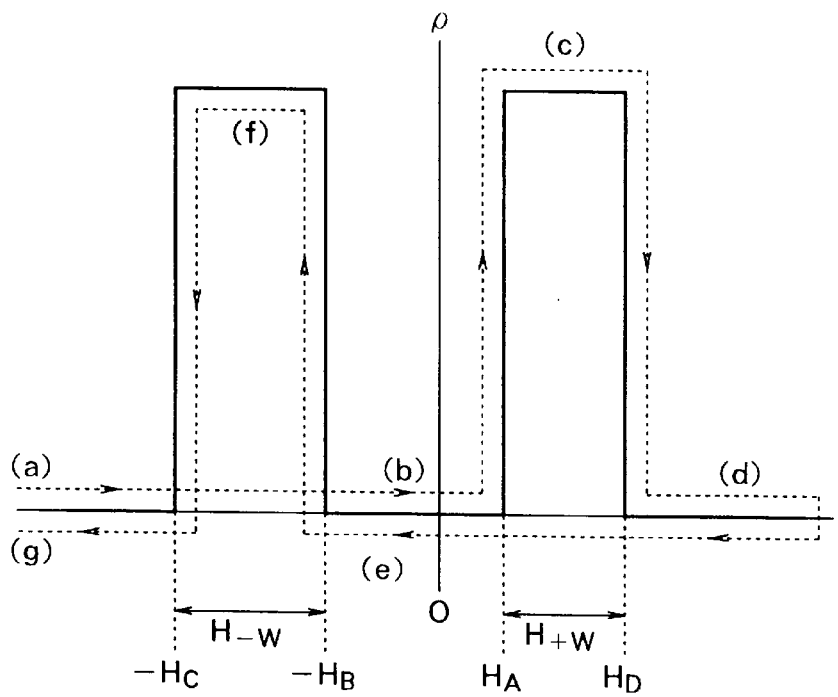
FIG. 4 shows an idealized magnetoresistance curve corresponding to the transitions in FIG. 3.

As the applied magnetic field is swept up and down, the magnetoresistive response of the magnetoresistive structure 4 has the general form shown in FIG. 4. The horizontal axis indicates the intensity of the applied magnetic field in arbitrary units; the vertical axis indicates the electrical resistivity ρ of the magnetoresistive structure 4 in arbitrary units. The solid line is the magnetoresistance curve. The dotted line and arrows indicate the path followed as the applied magnetic field is swept up from state (a) to state (d), then down from state (d) to state (g), the letters in parentheses having the same meaning as in FIG. 3.

In FIG. 4, $H_A$ indicates the positive magnetic field that reverses the magnetization of the second ferromagnetic layer 18 from left to right. $-H_B$ indicates the stronger negative magnetic field that reverses the magnetization of the first ferromagnetic layer 18 from right to left. $-H_C$ indicates the still stronger negative magnetic field that reverses the magnetization of the second ferromagnetic layer 18 from right to left. $H_D$ indicates the positive magnetic field that reverses the magnetization of the first ferromagnetic layer 14 from left to right. $H_{+W}$ indicates the range of magnetic fields from $H_A$ to $H_D$, and $H_{-W}$ indicates the range of magnetic fields from $-H_B$ to $-H_C$. A useful feature of this spin valve 6 is the asymmetry of the magnetoresistance curve with respect to the zero magnetic field: the $H_{+W}$ range is closer to zero than the $H_{-W}$ range.

Figure 5:
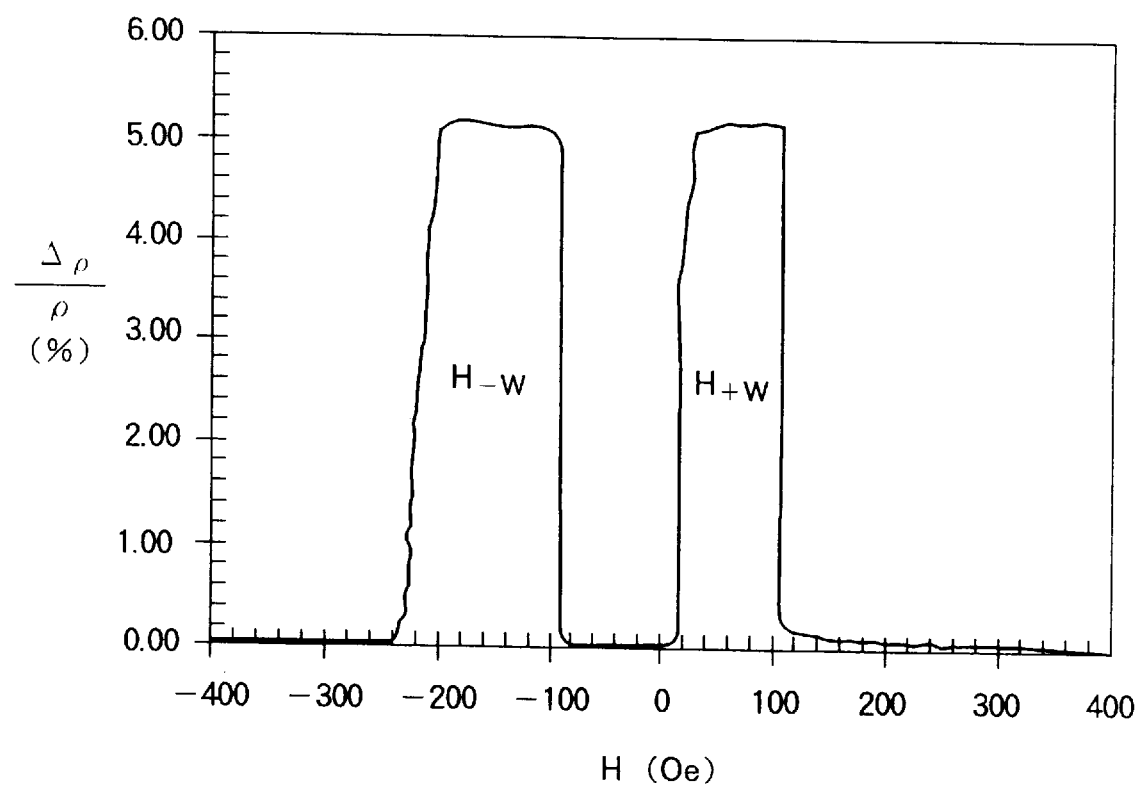
FIG. 5 shows a measured magnetoresistance curve.

FIG. 5 shows a measured magnetoresistance curve obtained using a magnetoresistive memory element in which the spin valves 6 had the following structure: the first and second ferromagnetic layers 14 and 18 were cobalt layers 60 Å thick; the nonmagnetic layer 16 was a copper layer 28 Å thick; and the antiferromagnetic layer 20 was an iron-manganese alloy layer 210 Å thick. The horizontal axis indicates the intensity of the applied magnetic field (H) in oersteds (Oe). The vertical axis indicates the percent change of the resistivity (ρ) of the ferromagnetic structure 4, referenced to the low-resistance state in which the spin valves are magnetized in the parallel state. The resistivity is about 5% higher in the antiparallel state than in the parallel state; the magnetoresistive structure 4 exhibits the so-called giant magnetoresistive effect.

In FIG. 5, the $H_{+W}$ range is from about 30 Oe to about 110 Oe, while the $H_{-W}$ range is from about −100 Oe to about −200 Oe. To obtain an adequate noise margin, $H_{+W}$ and $H_{-W}$ need to be somewhat removed from the zero magnetic field. To avoid excessive current consumption, $H_{+W}$ and $H_{-W}$ should not be too widely removed from the zero magnetic field. To obtain an adequate control margin, one or both of the $H_{+W}$ and $H_{-W}$ ranges must have at least a certain minimum width. These requirements are all satisfied in FIG. 5.

Figure 6:
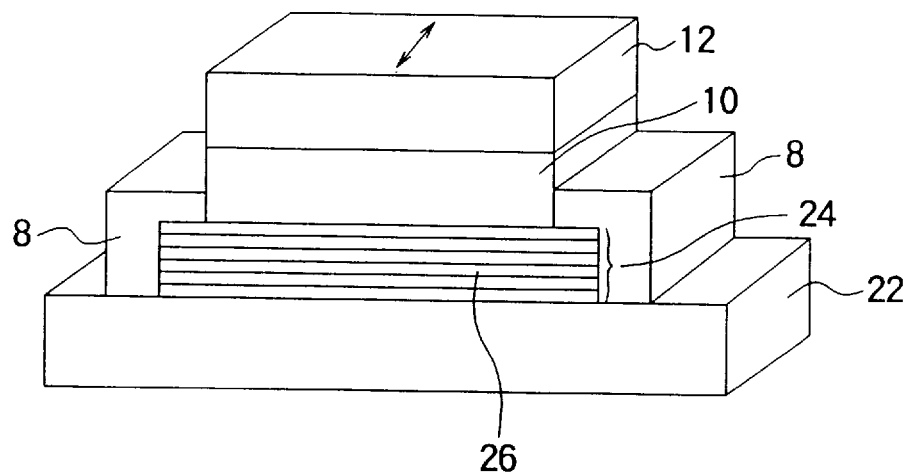
FIG. 6 illustrates another type of magnetoresistive memory element.

Next another type of magnetoresistive memory element that can be employed in the present invention will be described. Referring to FIG. 6, this element is formed on, for example, a glass substrate 22. The sensing electrodes 8, insulating layer 10, and writing electrode 12 are similar to the elements with the same reference numerals in FIG. 1. The magnetoresistive structure 24 comprises at least one magnetoresistive unit structure 26.

Figure 7:
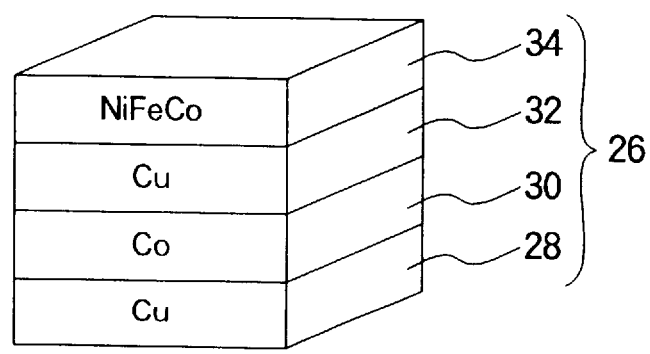
FIG. 7 illustrates the structure of one magnetoresistive unit layer in FIG. 6.

Referring to FIG. 7, each unit structure 26 comprises a nonmagnetic layer 28, a first ferromagnetic layer 30, another nonmagnetic layer 32, and a second ferromagnetic layer 34. The nonmagnetic layers 28 and 32 can be made of copper, for example. The first and second ferromagnetic layers 30 and 34 must have different coercivities. In the illustrated example, the first ferromagnetic layer 30 is made of cobalt, which is a comparatively hard ferromagnetic material, while the second ferromagnetic layer 34 is made of a nickel-iron-cobalt alloy (NiFeCo), which is a comparatively soft ferromagnetic layer material and has a lower coercivity. This magnetoresistive structure 24 also exhibits the giant magnetoresistive effect.

Figure 8:
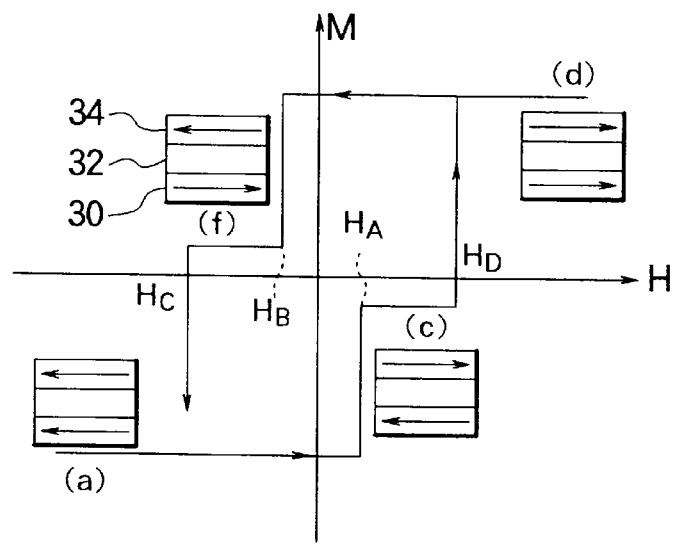
FIG. 8 illustrates transitions in the magnetization of the memory element in FIG. 6 in response to an applied magnetic field.

Positive and negative currents supplied to the writing electrode 12 in FIG. 6 produce positive and negative magnetic fields as described above. FIG. 8 shows the response of the magnetoresistive structure 24 to an applied magnetic field. Initially a strong negative magnetic field is applied, magnetizing both the first and second ferromagnetic layers 30 and 34 toward the left (a). If the applied magnetic field is swept up, when a certain positive value $H_A$ is reached, the magnetization of the comparatively soft second ferromagnetic layer 34 is reversed to point to the right (c). At a stronger positive magnetic field $H_D$ the magnetization of the comparatively hard first ferromagnetic layer 30 is also reversed (d). Similarly, when the applied magnetic field is swept down from positive to negative, at a negative field intensity $H_B$ the magnetization of the second ferromagnetic layer 34 is reversed to point to the left (f), and at a stronger negative field intensity $H_C$ the magnetization of the first ferromagnetic layer 30 is also reversed to point to the left (a).

Figure 9:
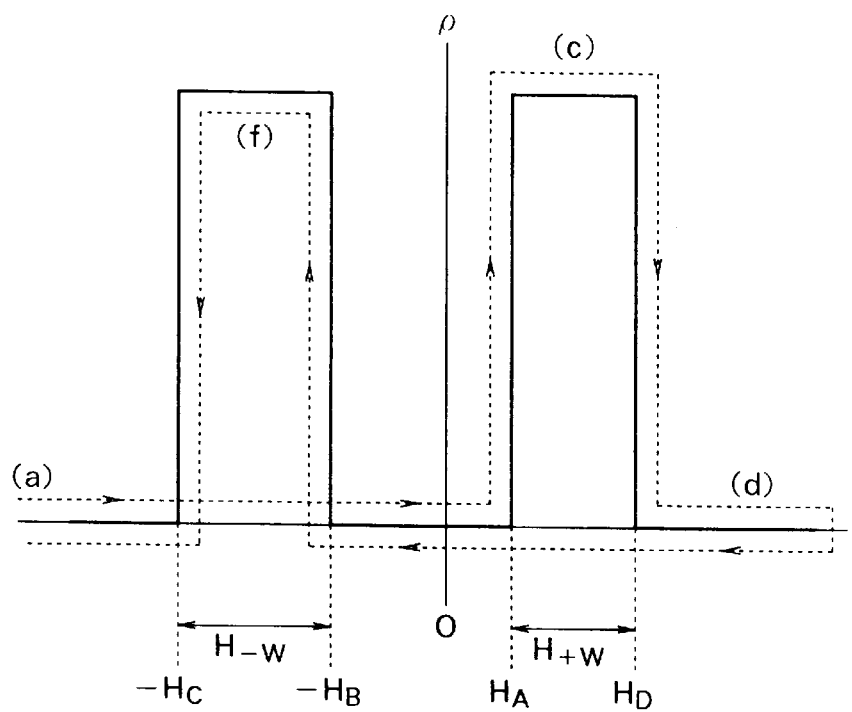
FIG. 9 shows the magnetoresistance curve corresponding to the transitions in FIG. 8.

The magnetoresistance curve of this magnetoresistive structure 24 is shown in FIG. 9, in which the vertical and horizontal axes, dotted lines, and various symbols have the same meaning as in FIG. 4. The difference between this magnetoresistance curve and the one in FIG. 4 is that this magnetoresistance curve is symmetric about zero: $-H_A$ has the same absolute magnitude as $H_B$, and $-H_C$ the same absolute magnitude as $H_D$.

The magnetoresistive memory elements in FIGS. 1 and 6 can be seen to share the following properties: both have at least two ferromagnetic layers that exhibit one electrical resistance when magnetized in a parallel state and a different electrical resistance when magnetized in an antiparallel state; both have a writing electrode 12; and both can be switched between the parallel and antiparallel states by a magnetic field generated solely by a flow of current through the writing electrode. Any magnetoresistive memory element having these properties can be employed in the present invention.

Figure 10:
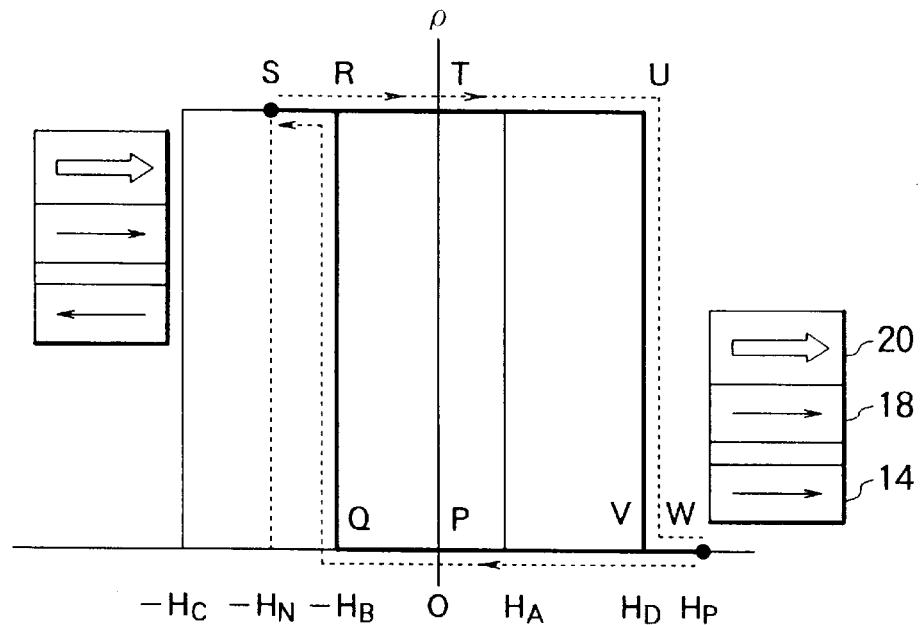
FIG. 10 illustrates the storage of binary information in the magnetoresistive memory element in FIG. 1.

FIG. 10 illustrates one possible scheme for storing binary information in the magnetoresistive memory element of FIG. 1. The vertical and horizontal axes and the symbols $H_A$, $H_B$, $H_C$, and $H_D$ have the same meanings as in FIG. 4.

The magnetoresistive memory element is initialized by means of a positive magnetic field exceeding intensity $H_D$, which forces both ferromagnetic layers 14 and 18 to align with the antiferromagnetic layer 20 in the parallel state, at point W on the magnetoresistance curve. When this field is removed, the ferromagnetic layers 14 and 18 remain magnetized in the parallel state, at point P on the magnetoresistance curve, as indicated by the dotted path from point W to point P.

To store one binary value (e.g. '0'), a negative magnetic field $-H_N$ in the range between $-H_B$ and $-H_C$ is applied, causing the ferromagnetic layers 14 and 18 to assume the antiparallel state via path P-Q-R-S. When this field is removed, the ferromagnetic layers remain in the antiparallel state (path S-R-T)

To change the stored information to the other binary value (e.g. '1'), a positive magnetic field $H_P$ exceeding $H_D$ is applied, causing the ferromagnetic layers 14 and 18 to reassume the parallel state, via path T-U-V-W. When this field is removed, the ferromagnetic layers remain in the parallel state (path W-V-P).

The magnetic fields applied by the writing current thus switch the magnetization of the first ferromagnetic layer 14, while the second ferromagnetic layer 18 remains pinned by spin-coupling with the antiferromagnetic layer 20. Initialization can be carried out by applying any positive field exceeding $H_D$. In the drawing, the positive field $H_P$ could be employed for initialization, for example. It is not necessary to re-initialize the memory element each time a new value is stored.

It is convenient for the positive and negative fields $H_P$ and $-H_N$ to have the same magnitude, so that they differ only in direction. For a maximum operating margin, it is desirable for $-H_N$ to be substantially halfway between $-H_B$ and $-H_C$. For a magnetoresistive memory element having the magnetoresistance curve illustrated in FIG. 5, for example, it would be desirable for $H_P$ and $-H_N$ to have positive and negative magnitudes of substantially 150 Oe. This is not a necessary condition, however: $H_P$ could be any positive magnetic field exceeding about 120 Oe, and $H_N$ could be any negative magnetic field between about −110 Oe and −190 Oe. It is not necessary for all information-writing operations to be performed with exactly the same current values, as long as the resulting magnetic fields are in these ranges.

Figure 11:
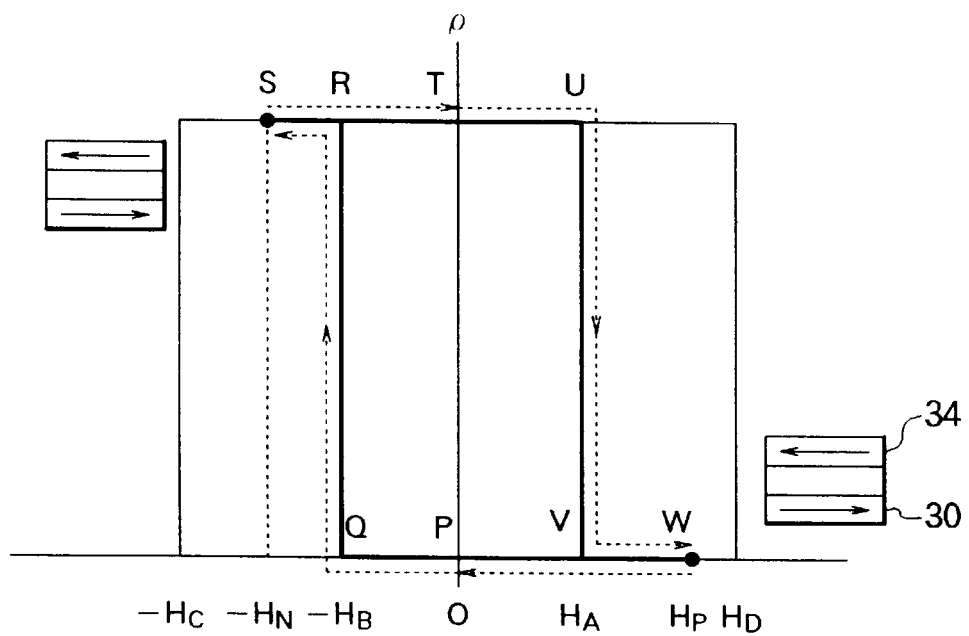
FIG. 11 illustrates the storage of binary information in the magnetoresistive memory element of FIg. 6.

FIG. 11 illustrates a similar scheme for storing binary information in the magnetoresistive memory element of FIG. 6, using the same symbols as in FIG. 10. This element is also initialized so that both ferromagnetic layers 30 and 34 are magnetized toward the right. The applied negative and positive magnetic fields $-H_N$ and $H_P$ switch the magnetization of the comparatively soft second ferromagnetic layer 34 without changing the magnetization of the comparatively hard first ferromagnetic layer 30, thus switching the ferromagnetic layers between the parallel and antiparallel states. It is again convenient for $H_P$ and $-H_N$ to have equal magnitudes.

Figure 12:
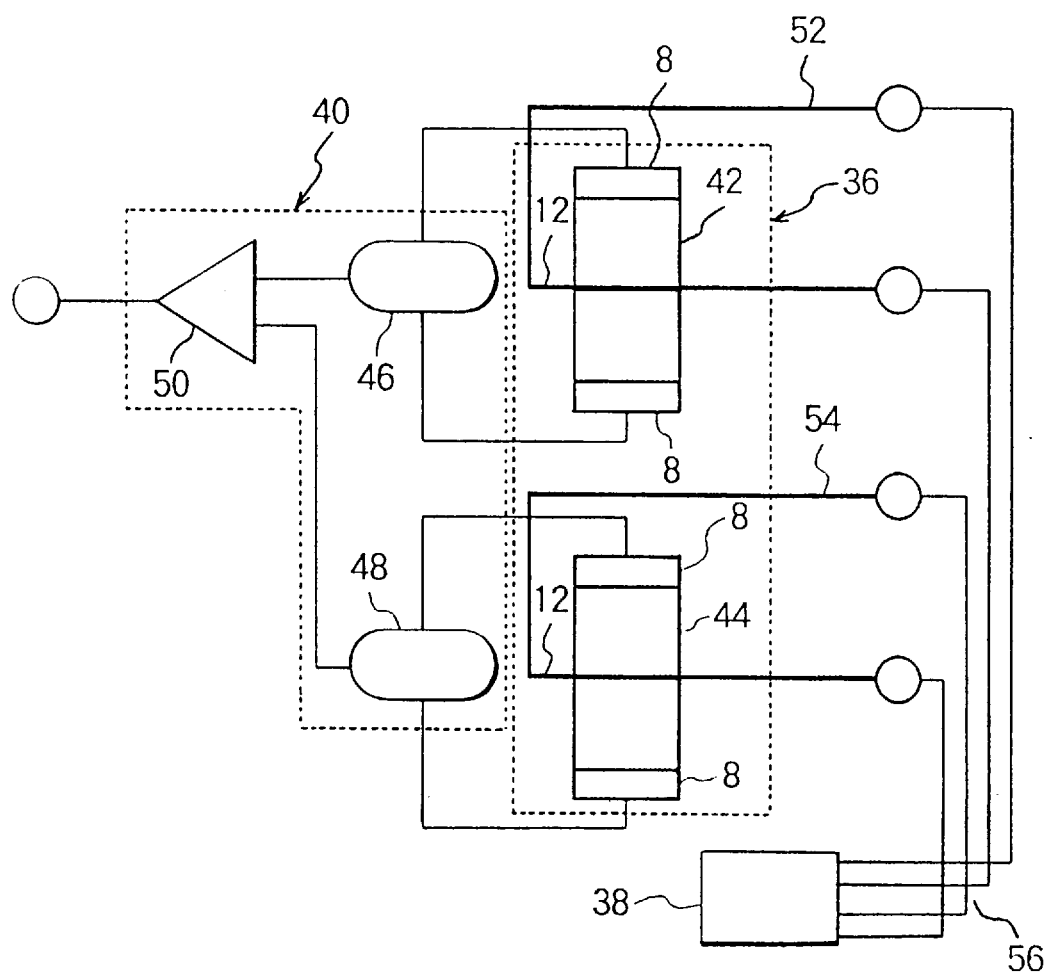
FIG. 12 illustrates a magnetoresistive memory cell having two magnetoresistive memory elements.

A simple magnetoresistive memory device will now be described. Referring to FIG. 12, the device comprises a memory cell 36, a write access circuit 38, and a read access circuit 40. The memory cell 36 comprises two magnetoresistive memory elements 42 and 44 of the same type, e.g. both of the type illustrated in FIGS. 1 to 4, or both of the type illustrated in FIGS. 6 to 9.

The read access circuit 40 comprises a pair of resistance-detecting means 46 and 48 coupled to the sensing electrodes 8 of respective memory elements 42 and 44, and a comparator 50 coupled to the resistance-detecting means 46 and 48.

The writing electrode 12 of memory element 42 forms part of a signal line 52, while the electrode 12 of memory element 44 forms part of a separate signal line 54. These signals lines 52 and 54 are coupled to the write access circuit 38 through four further signal lines 56.

Next, the operations of reading and writing binary information in this memory device will be described.

To write a first binary value (e.g. '0') in the memory cell 36, the write access circuit 38 supplies currents to the signal lines 52 and 54 so that the ferromagnetic layers in memory element 42 are set to the parallel state, and the ferromagnetic layers in memory element 44 are set to the antiparallel state. With the memory elements described in FIGS. 1 to 11, the write access circuit 38 supplies signal line 52 with a positive current producing the magnetic field $H_P$, and supplies signal line 54 with a negative current producing the magnetic field $-H_N$. These currents are supplied for a brief interval, then switched off, leaving memory element 42 magnetized in the parallel state and memory element 44 magnetized in the antiparallel state.

To write a second binary value (e.g. '1') in the memory cell 36, the write access circuit 38 supplies currents that set memory element 42 to the antiparallel state, and memory element 44 to the parallel state. For example, a negative current producing magnetic field $-H_N$ is supplied to signal line 52, and a positive current producing magnetic field $H_P$ is supplied to signal line 54.

To read the binary value stored in the memory cell, the resistance-detecting means 46 and 48 detect the resistance values of the ferromagnetic layers in memory elements 42 and 44, and the comparator 50 compares the detected resistance values. The output of the comparator 50 indicates the first binary value or second binary value according to whether the resistance detected from the first memory element 42 is less than or greater than the resistance detected from the second memory element 42.

Resistance can be detected by, for example, supplying a constant current to the sense electrodes 8 of the memory elements 42 and 44 and detecting the resulting voltages, or by supplying a constant voltage and detecting the resulting currents. The resistance-detecting means 46 and 48 can thus be current-source means that pass parallel currents through memory elements 42 and 44, in which case the comparator 50 compares the voltages at corresponding points on the two parallel current paths, or the resistance-detecting means 46 and 48 can be voltage-source means that supply equal voltages to memory elements 42 and 44, in which case the comparator 50 compares the currents flowing through memory elements 42 and 44.

Compared with prior-art devices that interrogate a magnetoresistive memory element by perturbing its magnetization state in order to read the stored information, the device in FIG. 12 has the advantage of faster read access and reduced current consumption, because no perturbation is necessary.

Compared with the prior art in which a memory cell had one active memory element and one fixed reference element, the memory cell 36 provides twice as wide an output signal swing, and has a correspondingly larger operating margin.

Figure 13:
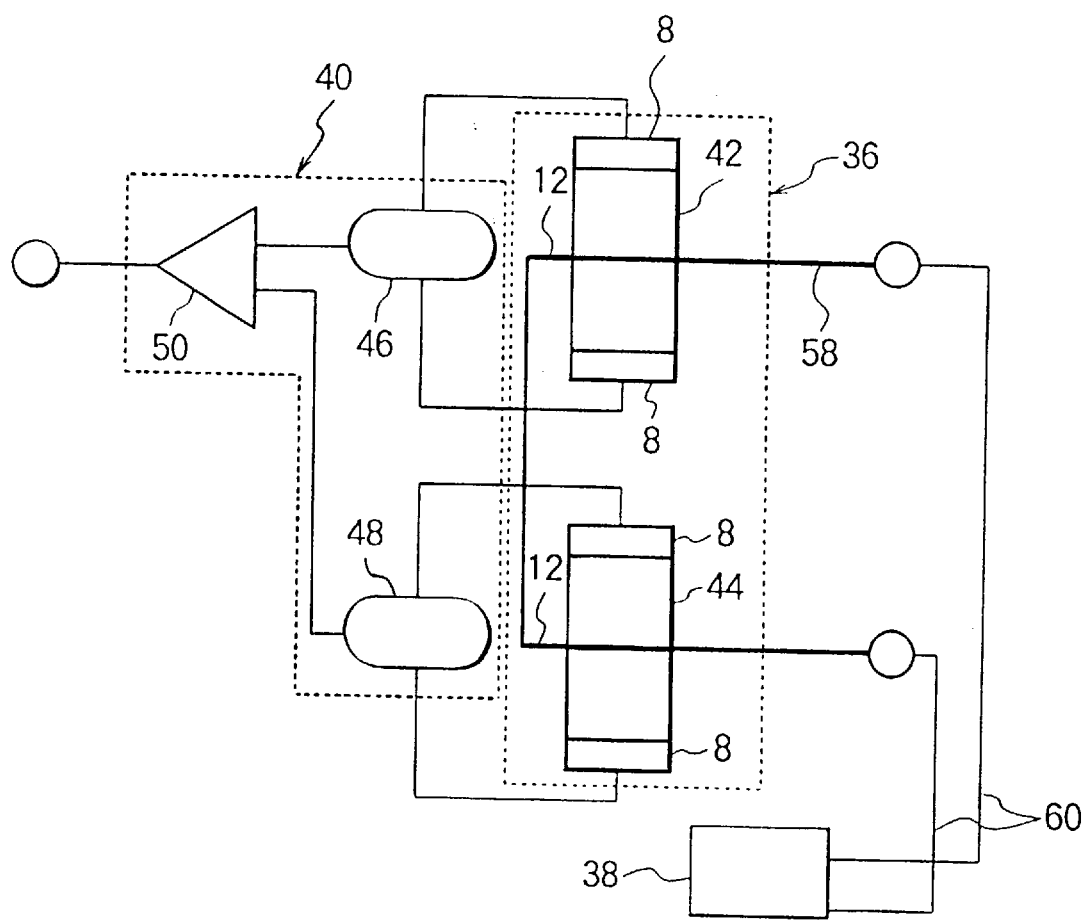
FIG. 13 illustrates another magnetoresistive memory cell having two magnetoresistive memory elements.

FIG. 13 illustrates a variation of the invented memory device, using the same reference numerals as in FIG. 12 for identical elements. The difference between FIGS. 12 and 13 is that in FIG. 13, the writing electrodes 12 of the memory elements 42 and 44 are coupled in series. Both electrodes 12 are part of a signal line 58, which is coupled to the write access circuit 38 by a single pair of signal lines 60. Signal line 58 is routed so that when a positive current flows through one of the two memory elements, a negative current flows through the other memory element. That is, a current flowing right-to-left through memory element 42 flows left-to-right through memory element 44, and vice versa. A single current thus suffices to set one memory element to the parallel state and the other memory element to the antiparallel state.

In FIG. 13, the two memory elements 42 and 44 cannot be initialized to the same right-pointing parallel state or left-pointing parallel state by a current flow through the two writing electrodes 12, because current flows through these two electrodes in opposite directions. Since initialization is only necessary when the device is fabricated, however, initialization can be carried out by means of an externally-generated magnetic field.

The memory device in FIG. 13 retains the advantages of the device in FIG. 12, but requires fewer signal lines, and has the further advantage that to write to the memory cell 36, the write access circuit 38 need only produce a single current flow. As the positive and negative currents necessarily have equal magnitudes, the write access circuit 38 can operate with a single current source (not visible), provided the current source is switchably coupled to the signal lines 60 so that current can be made to flow in either direction.

Next a further modification of the method of storing information in the magnetoresistive memory device of FIG. 12 or FIG. 13 will be described. This modification enables ternary information to be stored.

Figure 14:
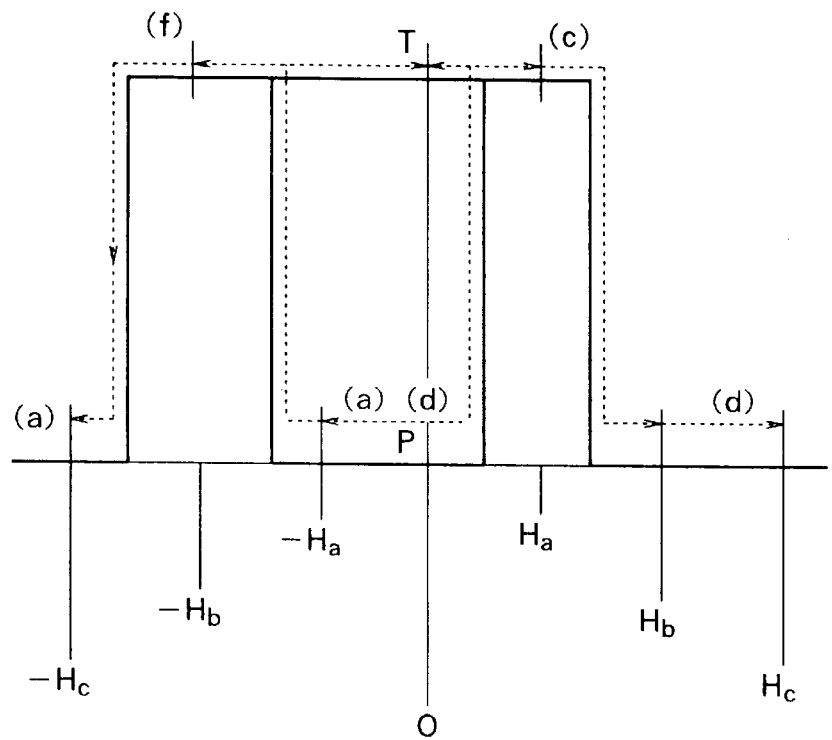
FIG. 14 illustrates the storage of ternary information in these memory cells when magnetoresistive memory elements of the type in FIG. 1 are employed.

This further modification is illustrated in FIG. 14 for the case in which the magnetic elements 42 and 44 are of the spin-valve type illustrated in FIGS. 1 to 4. The vertical and horizontal axes and the symbols (a), (c), (d), and (f) have the same meaning as in FIG. 4. The write access circuit 38 is capable of supplying currents of three different magnitudes. By flowing in the positive and negative directions, these currents generate three positive magnetic fields $H_a$, $H_b$, and $H_c$, and three negative magnetic fields $-H_a$, $-H_b$, and $-H_c$, which are related as shown to the magnetoresistance curve.

To write a ternary value into the memory cell 36, the write access circuit 38 begins by supplying an initializing current that generates magnetic fields of $-H_c$ in memory element 42 and $H_c$ in memory element 44. These fields initialize the ferromagnetic layers 14 and 18 in memory element 42 to the left-pointing state (a), and the ferromagnetic layers 14 and 18 in memory element 44 to the right-pointing state (d). The initializing current is then switched off, leaving both memory elements at point P on the magnetoresistance curve. This initialization process is performed each time a ternary value is stored in the memory cell 36.

Next, to store a first ternary value (e.g. '−1'), the write access circuit 38 supplies a current that generates magnetic fields of $H_a$ in memory element 42 and $-H_a$ in memory element 44. These fields switch the ferromagnetic layers 14 and 18 in memory element 42 to the antiparallel state (c), while leaving the ferromagnetic layers 14 and 18 in memory element 44 in the parallel state (d). When this current is switched off, memory element 42 moves to point T on the magnetoresistance curve, while memory element 44 reverts to point P.

Alternatively, to store a second ternary value (e.g. '+1'), the write access circuit 38 supplies a current that generates magnetic fields of fib in memory element 42 and $-H_b$ in memory element 44. The $H_b$ field takes memory element 42 through the antiparallel state (c) to the parallel state (d) in which both ferromagnetic layers 14 and 18 are magnetized toward the right. The $-H_b$ field takes memory element 44 to the antiparallel state (f), in which the first ferromagnetic layer 14 is magnetized toward the left and the second ferromagnetic layer 18 is magnetized toward the right. When this current is switched off, memory element 42 reverts to point P on the magnetoresistance curve, while memory element 44 moves to point T.

To store a third ternary value (e.g. '0'), the write access circuit 38 supplies a current that generates magnetic fields of $H_c$ in memory element 42 and $-H_c$ in memory element 44. The $H_c$ field takes memory element 42 through the antiparallel state (c) to the parallel state (d) in which both ferromagnetic layers 14 and 18 are magnetized toward the right, while the $-H_c$ field takes memory element 44 through the antiparallel state (f) to the parallel state (a) in which both ferromagnetic layers 14 and 18 are magnetized toward the left. When this current is switched off, both memory elements 42 and 44 revert to point P on the magnetoresistance curve.

An alternative method of storing the third ternary value is to supply no current, so that the memory elements 42 and 44 are left in their initial state, with memory element 42 in state (a) and memory element 44 in state (d). Again, both memory elements are left at point P on the magnetoresistance curve.

To read the stored ternary value, the comparator 50 compares the resistances detected by the resistance-detecting means 46 and 48. If the resistance of memory element 42 exceeds the resistance of memory element 44 by at least a certain threshold, the comparator output indicates the first ternary value. If the resistance of memory element 44 exceeds the resistance of memory element 42 by at least this threshold, the comparator output indicates the second ternary value. If the two resistance values differ by less than the threshold, the comparator output indicates the third ternary value.

Storing ternary information requires more current than storing binary information, because of the need for initialization each time a new value is stored, but read access speed is not impaired, there is no increase in read-access current consumption, and of course the information storage capacity is increased. The read access circuit 40 must be capable of detecting the resistance difference between the two memory elements more accurately than for binary information, but the accuracy requirement is no greater than for the prior-art memory device that employs a reference memory element in every memory cell.

Figure 15:
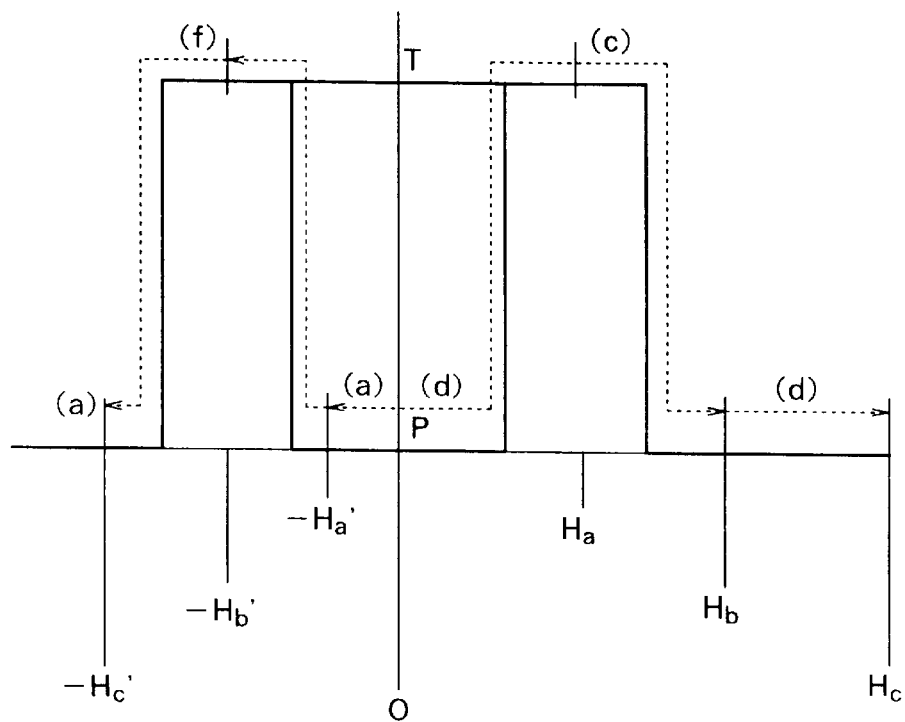
FIG. 15 illustrates the storage of ternary information when magnetoresistive memory elements of the type in FIG. 6 are employed.

FIG. 15 illustrates a further modification that enables ternary information to be stored in a magnetoresistive memory device employing memory elements of the type illustrated in FIGS. 6 to 9. The vertical and horizontal axes and symbols in FIG. 15 have the same meaning as in FIG. 14. Since the magnetoresistance curves of the memory elements are now symmetric about zero, the write access circuit 38 must supply currents that produce negative magnetic fields $-H_a'$, $-H_b'$, and $-H_c'$ with absolute magnitudes differing from the corresponding positive magnetic fields $H_a$, $H_b$, and $H_c$. In FIG. 15, $|-H_a'|<|H_a|$,
$|-H_b'|<|H_b|$, and
$|-H_c'|<|H_c|$.

Figure 16:
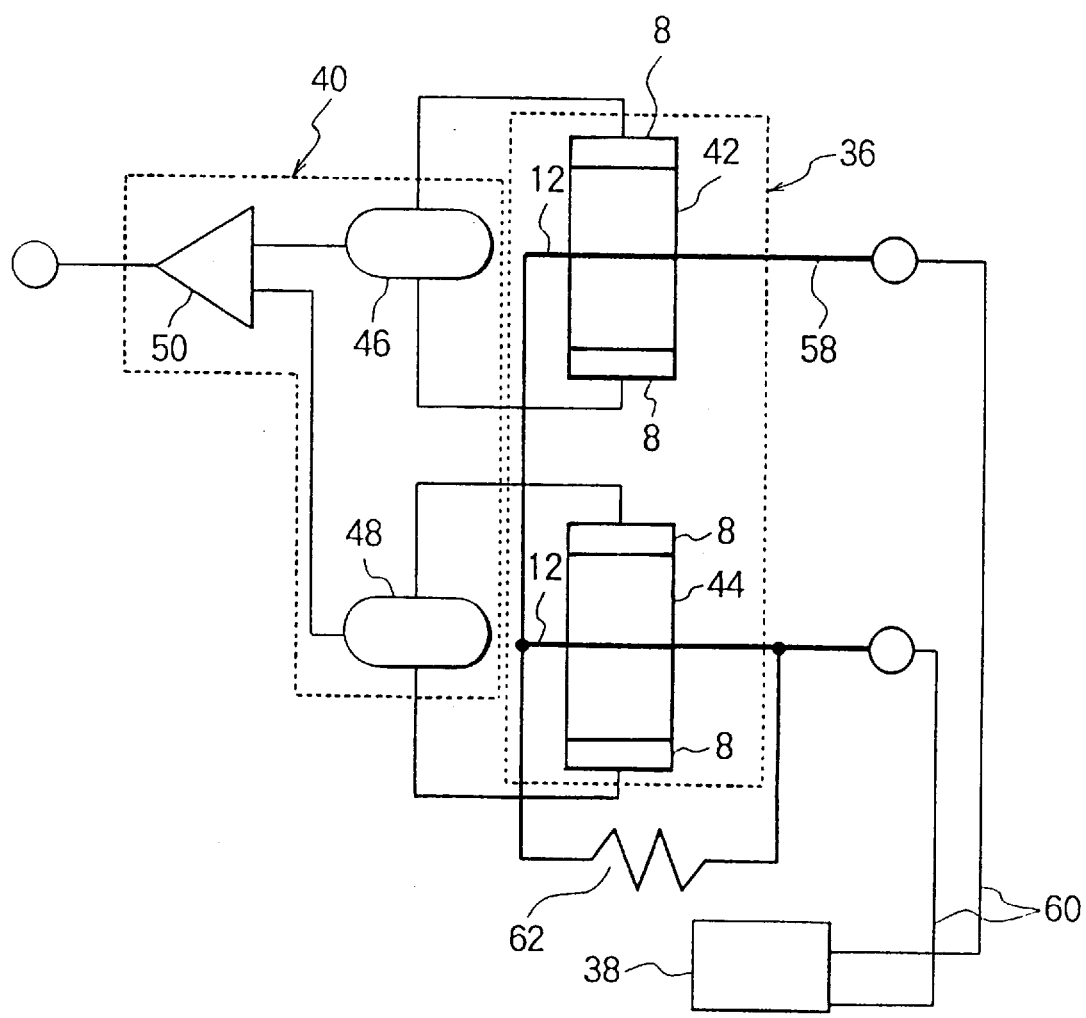
FIG. 16 illustrates a magnetoresistive memory cell employing magnetoresistive memory elements of the type in FIG. 6, adapted for storing ternary information.

These magnetic fields can be produced by the magnetoresistive memory device shown in FIG. 16, which is substantially identical to the device shown FIG. 13 but has an additional resistor 62 that shunts part of the current supplied by the write access circuit 38, the shunted current bypassing memory element 44. The currents supplied to memory element 44 are therefore smaller in absolute magnitude than the currents supplied to memory element 42.

The operation of the magnetoresistive memory device depicted in FIGS. 15 and 16 can be understood from the explanation of FIGS. 13 and 14, so a detailed description will be omitted.

Figure 17:
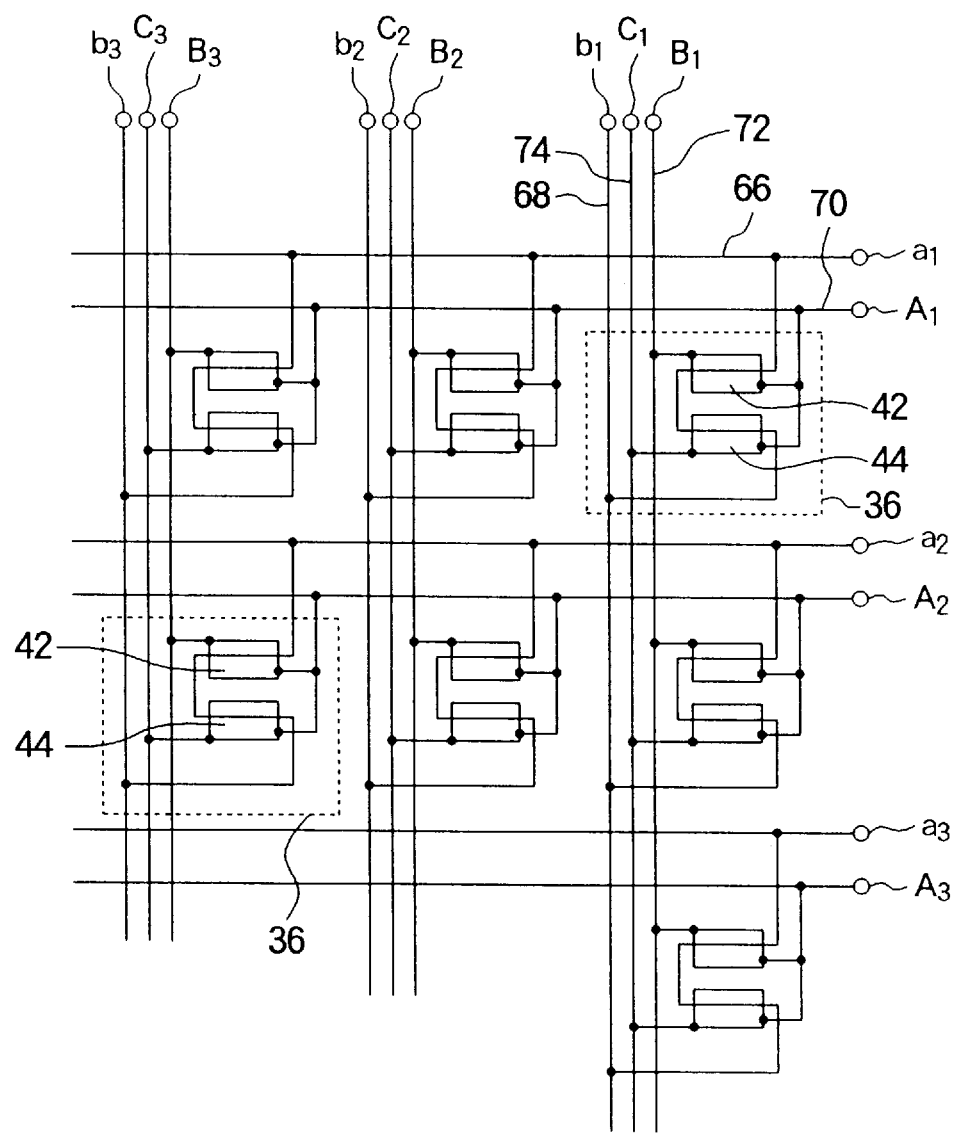
FIG. 17 schematically illustrates part of a magnetoresistive random-access memory device.

A plurality of memory cells 36 of the type shown in FIG. 13 or 16 can be disposed in a row-column array and linked to signal lines to form a random-access memory, as illustrated in FIG. 17. FIG. 17 shows only part of the memory-cell array, to illustrate the signal-line interconnections. The memory also has read and write access circuits similar to those in FIG. 13 or 16.

Each memory cell 36 in FIG. 17 is disposed at the intersection of a horizontal row and a vertical column, and is accessed via five signal lines. The memory cell 36 in the top right, for example, is accessed via write signal lines 66 and 68 and read signal lines 70, 72, and 74. One write signal line and one read signal line are provided for each row of memory cells. One write signal line and two read signal lines are provided for each column of memory cells. In the drawing, the write signal in the n-th row is denoted $a_n$, the write signal in the n-th column is denoted $b_n$, the read signal line in the n-th row is denoted $A_n$, and the read signal lines in the n-th column are denoted $B_n$ and $C_n$ (n=1, 2, . . . ).

Information can be stored in the memory cell 36 in the first row and first column, for example, by supplying an appropriate current through write signal lines $a_1$ and $b_1$. Information can be read from this memory cell by supplying a constant current to read signal line $A_1$ and comparing the resulting voltages on read signal lines $B_1$ and $C_1$. The constant current supplied to read signal line $A_1$ branches in parallel through the two memory cells 42 and 44. Alternatively, a constant voltage can be supplied to read signal line $A_1$, and the resulting currents on read signal lines $B_1$ and $C_1$ compared. In either case, signal line $B_1$ serves for detecting the resistance of memory element 42 in this memory cell, while signal line $C_1$ serves for detecting the resistance of memory element 44.

Similarly, information can be stored in the memory cell 36 in the second row and third column by sending current through signal lines $a_2$ and $b_3$, and read from this memory cell by supplying a constant current or voltage to signal line $A_2$ and comparing the resulting voltages or currents on signal lines $B_3$ and $C_3$. Other memory cells in the array are accessed in a like manner.

The entire memory in FIG. 17 can be served by a single write access circuit and a single read access circuit of the type shown in FIG. 13, if switching or decoding circuits are provided to couple these access circuits selectively to the signal lines in different rows and columns. If simultaneous access to a plurality of memory cells is desired, it suffices to provide a corresponding plurality of write access circuits and read access circuits.

The memory in FIG. 17 can store either binary or ternary information, but considerable gains in storage capacity can be realized by storing information in ternary form. For example, nine binary bits (an eight-bit byte and a parity check bit) can be coded for storage in ternary form in just six memory cell, increasing the storage capacity of the memory by a factor of 1.5.

Figure 18:
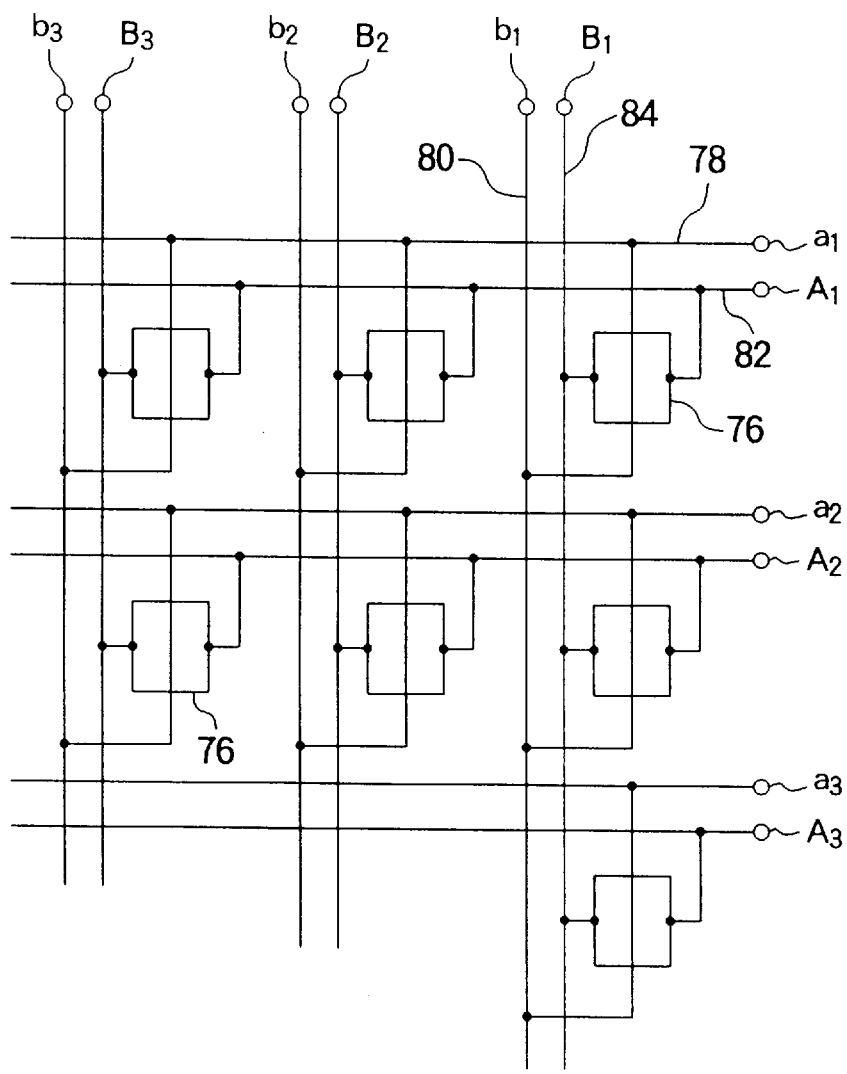
FIG. 18 schematically illustrates part of another magnetoresistive random-access memory device.

If the resistance of individual memory elements can be accurately detected, the memory in FIG. 17 can be simplified by using only one memory element per memory cell, as illustrated in FIG. 18. The memory cells 76 in this memory are magnetoresistive memory elements of, for example, the type shown in either FIG. 1 or FIG. 6. Each memory cell (element) 76 is accessed by four signal lines, e.g. the top right memory cell by write signal lines 78 and 80 and read signal lines 82 and 84. The m-th row of memory cells has one write signal line $a_m$ and one read signal line $A_m$; the n-th column of memory cells has one write signal line $b_n$ and one read signal line $B_n$ (where m and n are arbitrary positive integers).

Write access to the memory cell in row m and column n in FIG. 18 is performed by supplying the appropriate current to write signal lines $a_m$ and $b_n$. Read access to this memory cell is performed by supplying a constant current or voltage to read signal line $A_m$ and detecting the resulting voltage signal or current signal on read signal line Bn. The read access circuit (not shown) outputs a '0' or a '1' according to whether or not the detected signal exceeds a certain threshold.

Successful read access to the memory in FIG. 18 depends on highly uniform fabrication of the memory cells and signal lines, whereas in FIG. 17, it is only necessary for the two memory elements in each memory cell to be mutually uniform, and for the two read signal lines $B_n$ and $C_n$ in each column to be mutually uniform. The memory in FIG. 17 thus has the advantage of easier fabrication.

The invention has been described by way of example through the above embodiments, but is not limited to these embodiments. Many variations are possible in the materials constituting the different layers of the magnetoresistive memory elements. In FIG. 2, for example, the ferromagnetic layers 14 and 18 may comprise nickel or iron instead of cobalt; or an alloy of these three metals, or of two of the three, may be employed. The nonmagnetic layer 16 may comprise silver (Ag) or chromium (Cr) instead of copper, and the antiferromagnetic layer 20 may comprise nickel oxide (NiO) or cobalt oxide (CoO) instead or iron-manganese. Thus the spin valve 6 may have a multilayer structure such as [NiO/Co/Cu/Co] or [FeMn/Fe/Cr/Fe]. In FIG. 7, iron or a cobalt-platinum (CoPt) alloy, for example, can be used in the comparatively hard ferromagnetic layer 30; an iron-nitride material (FeN) or a material comprising iron, silicon, and aluminum (FeSiAl) can be used in the comparatively soft ferromagnetic layer 34; and silver or chromium can be used in the nonmagnetic layers. Possible structures thus include artificial lattice structures such as [{Fe/Ag/FeN}/Ag] or [{CoPt/Cr/FeSiAl}/Cr].

It is not necessary for the sense electrodes 8 of the magnetoresistive memory elements to be disposed on a line at right angles to the flow of writing current, as shown in FIGS. 1 and 6. The line joining the sense electrodes 8 may be parallel to the flow of writing current, or inclined at an angle other than a right angle.

In writing to the memory cells, it is not necessary to follow the paths on the magnetoresistance curves indicated in FIGS. 10, 11, 14, and 15; other paths can be followed. In FIG. 14 or 15, for example, the third ternary value could be stored by generating magnetic fields that set both memory elements to the antiparallel state.

It is not necessary for the memory cells to employ memory elements of the types shown in FIG. 1 or 6. Any type of magnetoresistive memory element that can be switched between parallel and antiparallel states by a current supplied to a writing electrode 12 can be employed, as noted earlier.

Those skilled in the art will recognized that further modifications are possible within the scope claimed below.

What is claimed is:

1. A magnetoresistive memory device for storing ternary information, comprising:

at least one memory cell having a first memory element and a second memory element, each of these memory elements separately having at least two ferromagnetic layers that collectively exhibit one electrical resistance when magnetized in a parallel state and a different electrical resistance when magnetized in an antiparallel state, and each of these memory elements separately having a writing electrode for the passage of a current generating a magnetic field capable of switching said ferromagnetic layers between said parallel state and said antiparallel state;

a write access circuit coupled to said memory cell, for supplying current to each said writing electrode in said memory cell, responsive to said ternary information, thereby storing a first ternary value in said memory cell by setting the ferromagnetic layers in said first memory element to said parallel state and the ferromagnetic layers in said second memory element to said antiparallel state, storing a second ternary value in said memory cell by setting the ferromagnetic layers in said first memory element to said antiparallel state and the ferromagnetic layers in said second memory element to said parallel state, and storing a third ternary value in said memory cell by setting the ferromagnetic layers in both said first memory element and said second memory element to identical states among said parallel state and said antiparallel state; and a read access circuit coupled to said memory cell, for comparing the electrical resistance of the ferromagnetic layers in said first memory element with the electrical resistance of the ferromagnetic layers in said second memory element, thereby reading the ternary value stored in said memory cell.

2. The magnetoresistive memory device of claim 1, wherein each of said memory elements comprises at least one antiferromagnetic layer for pinning a respective one of said ferromagnetic layers in a certain magnetization state.

3. The magnetoresistive memory device of claim 1, wherein said ferromagnetic layers have different coercivities.

4. The magnetoresistive memory device of claim 1, wherein said writing electrode of said first memory element and said writing electrode of said second memory element are coupled in series.

5. The magnetoresistive memory device of claim 1, comprising a plurality of memory cells as described in claim 1, disposed in an array having rows and columns, and further comprising:

a plurality of first signal lines disposed in respective rows, coupling said write access circuit to said memory cells;

a plurality of second signal lines disposed in respective columns, coupling said write access circuit to said memory cells;

a plurality of third signal lines disposed in respective rows, coupling said read access circuit to said memory cells;

a plurality of fourth signal lines disposed in respective columns, coupling said read access circuit to said memory cells; and a plurality of fifth signal lines disposed in respective columns, coupling said read access circuit to said memory cells; wherein said write access circuit supplies said current to the writing electrode of an arbitrary one of said memory cells through a corresponding one of said first signal lines and a corresponding one of said second signal lines.

6. The magnetoresistive memory device of claim 5, wherein in each of said memory cells, the ferromagnetic layers of said first memory element and the ferromagnetic layers of said second memory element are both coupled to a single one of said third signal lines, the ferromagnetic layers of said first memory element are coupled to one of said fourth signal lines, and the ferromagnetic layers of said second memory element are coupled to one of said fifth signal lines.

7. The magnetoresistive memory device of claim 6, wherein said read access circuit reads the ternary value stored in an arbitrary one of said memory cells by supplying a certain current to a corresponding one of said third signal lines and comparing resulting voltages on a corresponding one of said fourth signal lines and a corresponding one of said fifth signal lines.

8. The magnetoresistive memory device of claim 6, wherein said read access circuit reads the ternary value stored in an arbitrary one of said memory cells by supplying a certain voltage to a corresponding one of said third signal lines and comparing resulting currents on a corresponding one of said fourth signal lines and a corresponding one of said fifth signal lines.

9. A method of storing and reading ternary information in a magnetoresistive memory cell having a first memory element and a second memory element, each of these memory elements separately having at least two ferromagnetic layers that collectively exhibit one electrical resistance when magnetized in a parallel state and a different electrical resistance when magnetized in an antiparallel state, and each of these memory elements separately having a writing electrode for the passage of a current generating a magnetic field capable of switching said ferromagnetic layers between said parallel state and said antiparallel state, comprising the steps of:

storing a first ternary value in said memory cell by supplying to the writing electrode of said first memory element a current that sets the ferromagnetic layers of said first memory element to said parallel state and supplying to the writing electrode of said second memory cell a current that sets the ferromagnetic layers of said second memory element to said antiparallel state;

storing a second ternary value in said memory cell by supplying to the writing electrode of said first memory element a current that sets the ferromagnetic layers of said first memory element to said antiparallel state and supplying to the writing electrode of said second memory cell a current that sets the ferromagnetic layers of said second memory element to said parallel state;

storing a third ternary value in said memory cell by supplying to the writing electrode of said first memory element and the writing electrode of said second memory element currents that set the ferromagnetic layers of both said first memory element and said second memory element to identical states among said parallel state and said antiparallel state; and reading the ternary value stored in said memory cell by comparing the electrical resistance of said first memory element with the electrical resistance of said second memory element.

10. The method of claim 9, comprising the further step of:

initializing said memory cell by supplying to the writing electrode of said first memory element a current that sets the ferromagnetic layers of said first memory element to said parallel state and supplying to the writing electrode of said second memory cell a current that sets the ferromagnetic layers of said second memory element to said parallel state.

11. The method of claim 9 wherein, in said step of storing a first ternary value, said step of storing a second ternary value, and said step of storing a third ternary value, a single current is supplied to both the writing electrode of said first memory element and the writing electrode of said second memory element, these writing electrodes being coupled in series.

12. The method of claim 9, wherein said step of reading comprises the further steps of:

supplying parallel currents to said first memory element and said second memory element; and comparing voltages produced by passage of said parallel currents through said first memory element and said second memory element.

13. The method of claim 9, wherein said step of reading comprises the further steps of:

supplying equal voltages to said first memory element and said second memory element; and comparing resulting currents flowing through said first memory element and said second memory element.

* * * * *